(12) United States Patent
Haneda et al.

(10) Patent No.: US 11,043,954 B2
(45) Date of Patent: Jun. 22, 2021

(54) OSCILLATION CIRCUIT, OSCILLATOR, COMMUNICATION DEVICE, AND METHOD OF CONTROLLING OSCILLATION CIRCUIT

(71) Applicant: Seiko Epson Corporation, Tokyo (JP)

(72) Inventors: Hideo Haneda, Matsumoto (JP); Akio Tsutsumi, Chino (JP); Hisahiro Ito, Minowa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/910,128

(22) Filed: Jun. 24, 2020

(65) Prior Publication Data

US 2020/0412371 A1 Dec. 31, 2020

(30) Foreign Application Priority Data

Jun. 25, 2019 (JP) .............................. JP2019-117093

(51) Int. Cl.
*H03B 5/04* (2006.01)
*H03B 5/06* (2006.01)
(Continued)

(52) U.S. Cl.
CPC ............... *H03L 7/099* (2013.01); *H03B 5/04* (2013.01); *H03B 5/06* (2013.01); *H03B 5/32* (2013.01);
(Continued)

(58) Field of Classification Search
CPC ... H03B 5/04; H03B 5/06; H03B 5/30; H03B 5/32; H03B 5/36–368; H03B 2200/0094; H03L 1/02–028; H03L 3/00
See application file for complete search history.

(56) References Cited

U.S. PATENT DOCUMENTS 5,525,936 A * 6/1996 Post .................... H03L 1/025
331/47
2006/0017518 A1 1/2006 Wilcox
(Continued)

FOREIGN PATENT DOCUMENTS

JP H11-298250 A 10/1999
JP 2003-032039 A 1/2003
(Continued)

*Primary Examiner* — Levi Gannon
(74) *Attorney, Agent, or Firm* — Harness, Dickey & Pierce, P.L.C.

(57) ABSTRACT

An oscillation circuit includes a first oscillation circuit configured to oscillate a resonator to generate a first oscillation signal, a second oscillation circuit configured to generate a second oscillation signal, a frequency measurement circuit configured to measure a frequency of the second oscillation signal based on the first oscillation signal in a first period in which the first oscillation circuit is in operation, a holding circuit configured to hold a measurement result by the frequency measurement circuit in a second period in which the first oscillation circuit is not in operation, and an oscillation signal generation circuit configured to generate a third oscillation signal based on the second oscillation signal and the measurement result held in the holding circuit in a third period in which the first oscillation circuit starts up, wherein the third oscillation signal is supplied to the first oscillation circuit in the third period.

11 Claims, 8 Drawing Sheets

(51) Int. Cl.
*H03B 5/32* (2006.01)
*H03L 1/02* (2006.01)
*H03L 3/00* (2006.01)
*H03L 7/099* (2006.01)
*H03B 5/36* (2006.01)

(52) U.S. Cl.
CPC ............ *H03B 5/368* (2013.01); *H03L 1/028* (2013.01); *H03L 3/00* (2013.01); *H03B 2200/0094* (2013.01)

(56) References Cited

U.S. PATENT DOCUMENTS

2009/0015342 A1* 1/2009 Kleveland ................ H03B 5/06
 331/116 R
2018/0316355 A1* 11/2018 Yamamoto ................ H03L 3/00

FOREIGN PATENT DOCUMENTS

| JP | 2003-051718 A | 2/2003 |
| JP | 2008-507894 A | 3/2008 |

* cited by examiner

OSCILLATION CIRCUIT, OSCILLATOR, COMMUNICATION DEVICE, AND METHOD OF CONTROLLING OSCILLATION CIRCUIT

The present application is based on, and claims priority from JP Application Serial Number 2019-117093, filed Jun. 25, 2019, the disclosure of which is hereby incorporated by reference herein in its entirety.

BACKGROUND

1. Technical Field

The present disclosure relates to an oscillation circuit, an oscillator, a communication device, and a method of controlling an oscillation circuit.

2. Related Art

In JP-A-2003-32039 (Document 1), there is described a piezoelectric oscillator in which output of the ring oscillator is supplied to a required region in an oscillation loop of a piezoelectric oscillation circuit having an amplifier circuit and a piezoelectric resonator only for a required time after power activation. According to this piezoelectric oscillator, since the ring oscillator operates only for the required time after the power activation, deterioration of the noise characteristic in the steady oscillation state does not occur.

In the piezoelectric oscillator described in Document 1, although the start-up characteristic of the piezoelectric oscillation circuit is improved by the output of the ring oscillator, since the oscillation frequency accuracy of the ring oscillator depends on an analog circuit characteristic, a variation in the start-up time thus reduced also increases due to a variation in semiconductor process and temperature characteristics inherent in the circuit elements.

SUMMARY

An oscillation circuit according to an aspect of the present disclosure includes a first oscillation circuit configured to oscillate a resonator to generate a first oscillation signal, a second oscillation circuit configured to generate a second oscillation signal, a frequency measurement circuit configured to measure a frequency of the second oscillation signal based on the first oscillation signal in a first period in which the first oscillation circuit is in operation, a holding circuit configured to hold a measurement result by the frequency measurement circuit in a second period in which the first oscillation circuit is not in operation, and an oscillation signal generation circuit configured to generate a third oscillation signal based on the second oscillation signal and the measurement result held in the holding circuit in a third period in which the first oscillation circuit starts up, wherein the third oscillation signal is supplied to the first oscillation circuit in the third period.

An oscillation circuit according to another aspect of the present disclosure includes a first oscillation circuit configured to oscillate a resonator to generate a first oscillation signal, a second oscillation circuit configured to generate a second oscillation signal, a frequency measurement circuit which includes a counter circuit configured to perform a counting operation based on the first oscillation signal and the second oscillation signal, and is configured to measure a frequency of the second oscillation signal, a holding circuit configured to hold a measurement result by the frequency measurement circuit, an oscillation signal generation circuit including a frequency divider circuit configured to divide the frequency of the second oscillation signal to generate a third oscillation signal, and a frequency division ratio control circuit configured to control a frequency division ratio of the frequency divider circuit based on the measurement result held in the holding circuit, and a switch circuit configured to electrically couple or decouple the frequency divider circuit and the first oscillation circuit to each other.

In the oscillation circuit according to the above aspect, the frequency measurement circuit may measure the frequency of the second oscillation signal a plurality of times, the holding circuit may sequentially hold the plurality of times of measurement results by the frequency measurement circuit, and the oscillation signal generation circuit may generate the third oscillation signal based on the plurality of times of measurement results held in the holding circuit.

In the oscillation circuit according to the above aspect, the frequency measurement circuit may measure the frequency of the second oscillation signal a plurality of times, and then calculate an average value of the frequencies of the second oscillation signal measured the plurality of times, and the holding circuit may hold the average value as the measurement result by the frequency measurement circuit.

The oscillation circuit according to the above aspect may further include a temperature sensor, wherein the holding circuit may hold temperature information detected by the temperature sensor when the frequency measurement circuit measures the frequency of the second oscillation signal, and the oscillation signal generation circuit may correct the measurement result held in the holding circuit based on a difference between the temperature information detected by the temperature sensor and the temperature information held in the holding circuit, and then generate the third oscillation signal based on the measurement result corrected.

An oscillator according to another aspect of the present disclosure includes the oscillation circuit according to any one of the above aspects, and the resonator.

A communication device according to another aspect of the present disclosure includes the oscillator according to the above aspect, and a processing circuit configured to make the oscillator perform an intermittent operation.

A communication device according to another aspect of the present disclosure includes an oscillator including the oscillation circuit according to any one of the above aspects, and a resonator and a processing circuit configured to make the oscillator perform an intermittent operation, wherein the oscillation circuit repeatedly perform an operation in the first period, an operation in the second period, and an operation in the third period as the intermittent operation.

In the communication device according to one of the above aspects, the processing circuit may perform advertising communication in BLE (Bluetooth Low Energy) when the oscillator is in operation.

A method of controlling an oscillation circuit according to another aspect of the present disclosure is a method of controlling an oscillation circuit including a first oscillation circuit configured to oscillate a resonator to generate a first oscillation signal, and a second oscillation circuit configured to generate a second oscillation signal, the method including a frequency measurement step of measuring a frequency of the second oscillation signal based on the first oscillation signal in a first period in which the first oscillation circuit is in operation, a holding step of holding a measurement result of the frequency in a second period in which the first oscillation circuit is not in operation, and an oscillation signal generation step of generating a third oscillation signal based on the second oscillation signal and the measurement result held in a third period in which the first oscillation circuit starts up, and outputting the third oscillation signal to the first oscillation circuit.

In the method of controlling the oscillation circuit according to the above aspect, the frequency measurement step, the holding step, and the oscillation signal generation step may be repeatedly performed in this order.

DESCRIPTION OF EXEMPLARY EMBODIMENTS

Some preferred embodiments of the present disclosure will hereinafter be described in detail using the accompanying drawings. It should be noted that the embodiments described below do not unreasonably limit the content of the present disclosure as set forth in the appended claims. Further, all of the constituents described below are not necessarily essential elements of the present disclosure.

1. Oscillator 1-1. First Embodiment

Figure 1:
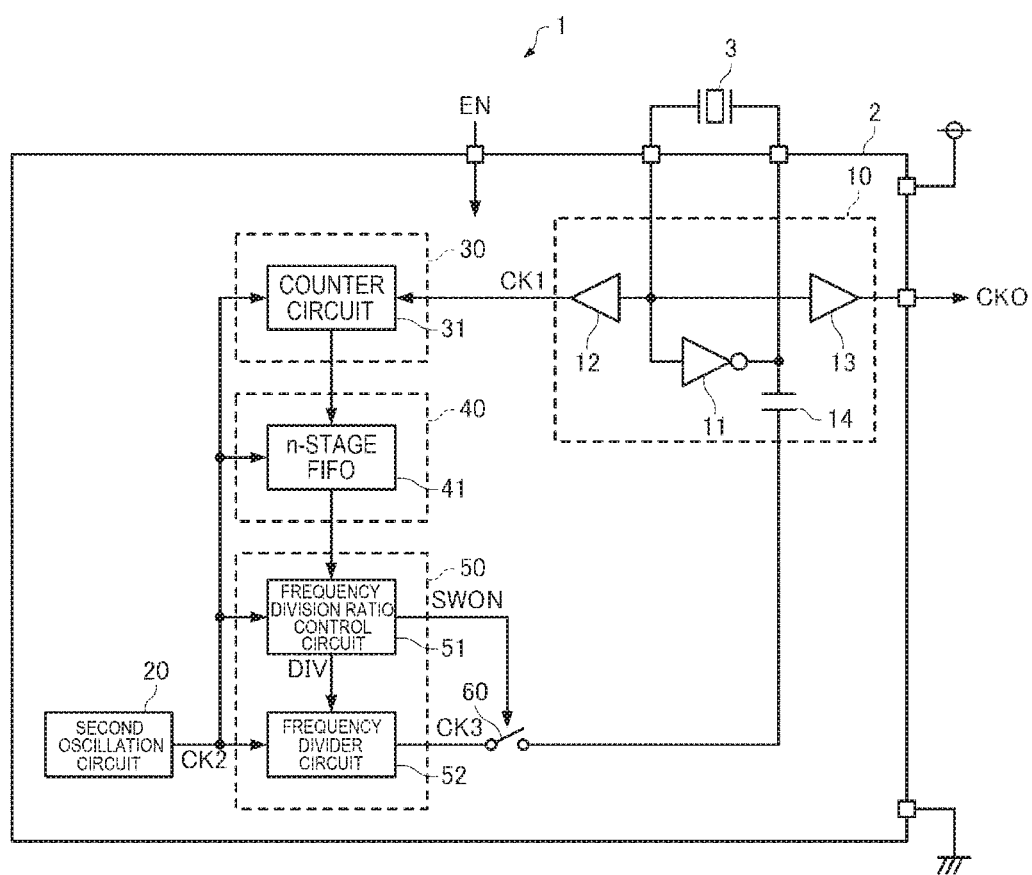
FIG. 1 is a diagram showing a configuration example of an oscillator according to a first embodiment.

FIG. 1 is a diagram showing a configuration example of an oscillator according to a first embodiment. As shown in FIG. 1, the oscillator 1 according to the first embodiment is provided with an oscillation circuit 2 and a resonator 3. The oscillation circuit 2 and the resonator 3 are housed in a package not shown.

In the present embodiment, the resonator 3 is a quartz crystal resonator using quartz crystal as a substrate material, and is, for example, an AT-cut crystal resonator or a tuning-fork crystal resonator.

In the present embodiment, the oscillation circuit 2 includes a first oscillation circuit 10, a second oscillation circuit 20, a frequency measurement circuit 30, a holding circuit 40, an oscillation signal generation circuit 50, and a switch circuit 60. It should be noted that the oscillation circuit 2 can be provided with a configuration obtained by omitting or modifying some of these constituents, or adding other constituents. The oscillation circuit 2 can be realized by a single-chip integrated circuit (IC), or can at least partially be configured using discrete components.

To the oscillation circuit 2, there is supplied an enable signal EN via an external connection terminal. The first oscillation circuit 10, the second oscillation circuit 20, the frequency measurement circuit 30, the holding circuit 40, the oscillation signal generation circuit 50, and the switch circuit 60 operate when the enable signal EN is in an active state, and stop when the enable signal EN is in an inactive state.

The first oscillation circuit 10 oscillates the resonator 3 to generate a first oscillation signal CK1.

In the present embodiment, the first oscillation circuit 10 includes an inverter element 11, a buffer element 12, a buffer element 13, and a capacitor 14.

The inverter element 11 has an input terminal and an output terminal respectively coupled to both ends of the resonator 3 via two external connection terminals of the oscillation circuit 2, and inversely amplifies a signal output from the resonator 3 to supply to the resonator 3 to thereby oscillate the resonator 3.

The buffer element 12 amplifies the signal output from the resonator 3 to generate the first oscillation signal CK1.

The buffer element 13 amplifies the signal output from the resonator 3 to generate an oscillation signal CKO. The oscillation signal CKO is output to the outside of the oscillator 1 via an external connection terminal of the oscillation circuit 2. In other words, the oscillator 1 outputs the oscillation signal CKO.

The capacitor 14 has one end coupled to one end of the resonator 3 via one of the two external connection terminals of the oscillation circuit 2, and the other end coupled to one end of the switch circuit 60.

The second oscillation circuit 20 generates a second oscillation signal CK2. The second oscillation circuit 20 can be, for example, a ring oscillator.

The frequency measurement circuit 30 measures the frequency of the second oscillation signal CK2 based on the first oscillation signal CK1.

In the present embodiment, the frequency measurement circuit 30 includes a counter circuit 31. The counter circuit 31 performs a counting operation based on the first oscillation signal CK1 and the second oscillation signal CK2. For example, the second oscillation signal CK2 is higher in frequency than the first oscillation signal CK1, and it is possible for the counter circuit 31 to count the number of rising edges of the second oscillation signal CK2 included in one cycle of the first oscillation signal CK1. The count value of the rising edges represents a frequency ratio between the second oscillation signal CK2 and the first oscillation signal CK1, and is a measurement result of the frequency of the second oscillation signal CK2.

The holding circuit 40 holds the measurement result by the frequency measurement circuit 30. In the present embodiment, the holding circuit 40 includes an n-stage FIFO (First In First Out) 41. The reference symbol n denotes an integer equal to or greater than 2. Further, the frequency measurement circuit 30 measures the frequency of the second oscillation signal CK2 a plurality of times, and the holding circuit 40 sequentially holds the plurality of times of measurement results by the frequency measurement circuit 30 in sync with the second oscillation signal CK2. Therefore, the n-stage FIFO 41 holds the last n times of measurement results.

The oscillation signal generation circuit 50 generates a third oscillation signal CK3 based on the second oscillation signal CK2 and the measurement results held in the holding circuit 40. In the present embodiment, the oscillation signal generation circuit 50 includes a frequency division ratio control circuit 51 and a frequency divider circuit 52, and generates the third oscillation signal CK3 based on the plurality of times of measurement results held in the holding circuit 40.

The frequency division ratio control circuit 51 controls the frequency division ratio DIV of the frequency divider circuit 52 based on the measurement results held in the holding circuit 40. Specifically, the frequency division ratio control circuit 51 sequentially retrieves the n times of measurement results held in the n-stage FIFO 41 in sync with the second oscillation signal CK2, and then outputs the measurement results thus sequentially retrieved to the frequency divider circuit 52 as the frequency division ratio DIV.

The frequency divider circuit 52 divides the frequency of the second oscillation signal CK2 with the frequency division ratio DIV to generate the third oscillation signal CK3. Since the frequency division ratio DIV is each of the n times of measurement results held in the n-stage FIFO 41, the average frequency of the third oscillation signal CK3 is substantially equal to the frequency of the first oscillation signal CK1.

Further, the frequency division ratio control circuit 51 outputs a switch control signal SWON which is activated only in the period in which the frequency divider circuit 52 generates the third oscillation signal CK3 corresponding to the n times of measurement results held in the n-stage FIFO 41.

The switch circuit 60 electrically couples or decouples the frequency divider circuit 52 and the first oscillation circuit 10 to each other based on the switch control signal SWON. Specifically, the switch circuit 60 electrically couples the frequency divider circuit 52 and the first oscillation circuit 10 to each other when the switch control signal SWON is in the active state, and electrically decouples the frequency divider circuit 52 and the first oscillation circuit 10 to each other when the switch control signal SWON is in the inactive state.

Therefore, in the period in which the switch control signal SWON is in the active state, the frequency divider circuit 52 and the first oscillation circuit 10 are electrically coupled to each other, and the third oscillation signal CK3 is supplied to the first oscillation circuit 10. The frequency divider circuit 52 and the resonator 3 are AC-coupled to each other by the capacitor 14 in the first oscillation circuit 10, and the third oscillation signal CK3 is input to one end of the resonator 3 via the capacitor 14.

In the present embodiment, the frequency measurement circuit 30 measures the frequency of the second oscillation signal CK2 based on the first oscillation signal CK1 in a first period P1 in which the first oscillation circuit 10 is in operation. Further, the holding circuit 40 holds the measurement results by the frequency measurement circuit 30 in a second period P2 in which the first oscillation circuit 10 is not in operation. Further, the oscillation signal generation circuit 50 generates the third oscillation signal CK3 based on the second oscillation signal CK2 and the measurement results held in the holding circuit 40 in a third period P3 in which the first oscillation circuit 10 starts up.

Here, the first period P1 is a period in which the frequency divider circuit 52 generates the third oscillation signal CK3 out of the period in which the enable signal EN is in the active state. Further, the second period P2 is a period in which the enable signal EN is in the inactive state. Further, the third period P3 is a period in which the frequency divider circuit 52 does not generate the third oscillation signal CK3 out of the period in which the enable signal EN is in the active state.

Figure 2:
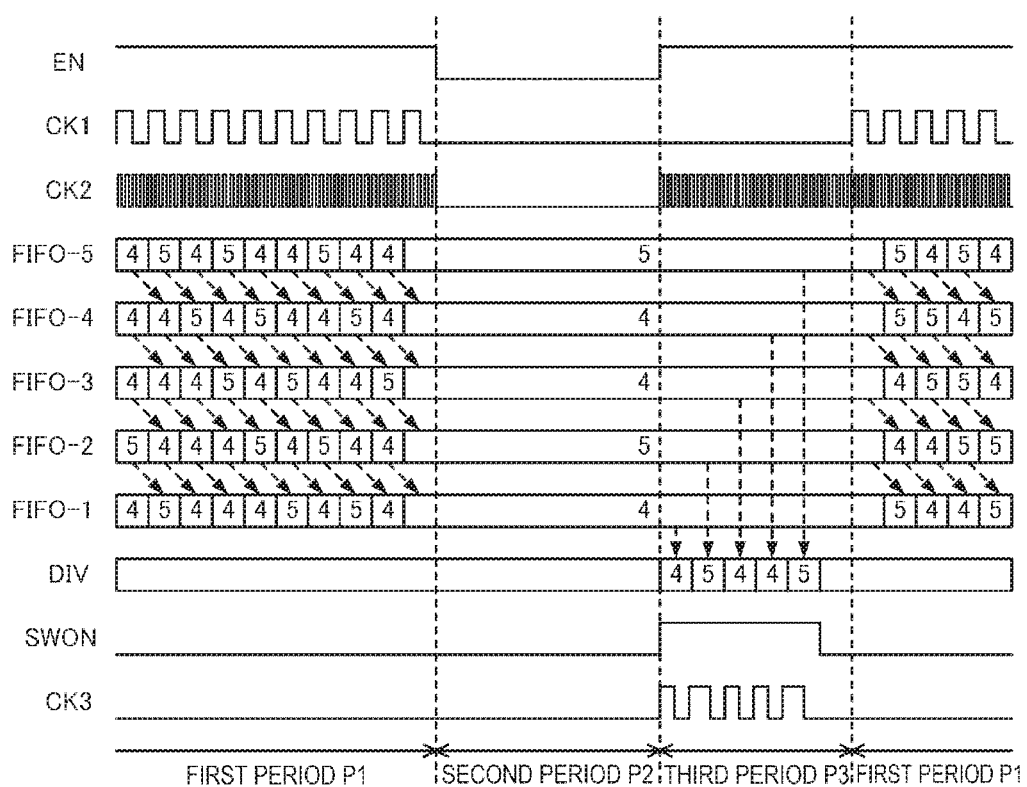
FIG. 2 is a timing chart showing an example of operation timing of the oscillator.

FIG. 2 is a timing chart showing an example of operation timing of the oscillator 1. In FIG. 2, there is shown an example when the number n of the stages of the n-stage FIFO 41 is five.

In the example shown in FIG. 2, the frequency measurement circuit 30 sequentially measures the frequency of the second oscillation signal CK2 in the first period P1, the holding circuit 40 holes the last five times of measurement results in the second period P2, the oscillation signal generation circuit 50 generates the third oscillation signal CK3 and the third oscillation signal CK3 is supplied to the resonator 3 in the third period P3. As described above, since the average frequency of the third oscillation signal CK3 in the third period P3 is substantially equal to the frequency of the first oscillation signal CK1 in the first period P1, the oscillation of the resonator 3 is excited by the third oscillation signal CK3. Therefore, the start-up time from when the enable signal EN changes from the inactive state to the active state to make the resonator 3 start the oscillation to when the amplitude of the oscillation signal output from the resonator 3 reaches the desired level is shortened.

Figure 3:
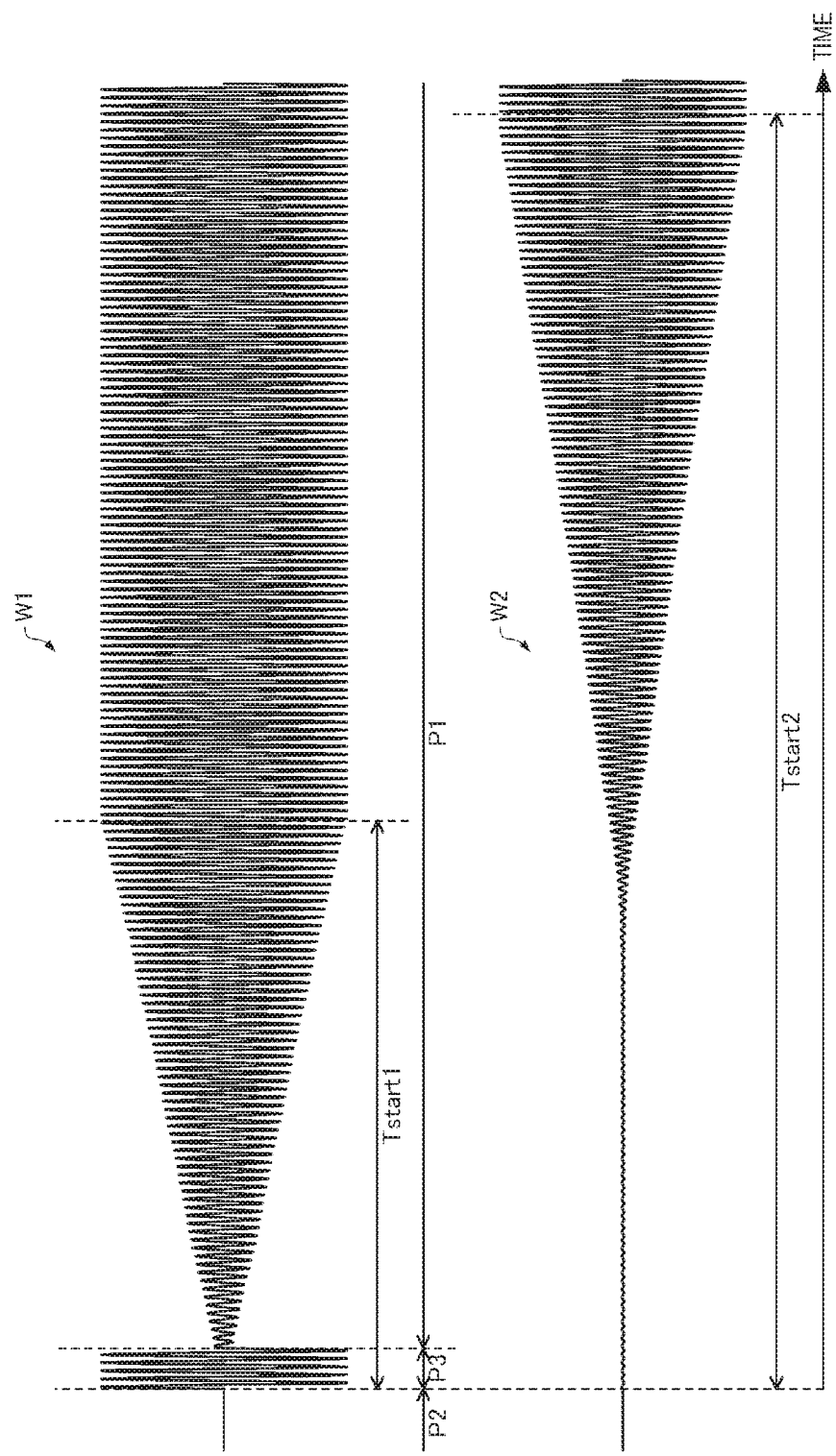
FIG. 3 is a diagram showing a waveform obtained by simplifying a measured waveform of an oscillation signal output from a resonator in a start-up period of the oscillator.

FIG. 3 is a diagram showing a waveform W1 obtained by simplifying a measured waveform of the oscillation signal output from the resonator 3 in the start-up period of the oscillator 1. It should be noted that in FIG. 3, there is also shown a waveform W2 obtained by simplifying a measured waveform of an oscillation signal output from a resonator in a related-art oscillator. In the example shown in FIG. 3, the start-up time Tstart1 of the oscillator 1 is shortened to a time equal to or shorter than half the start-up time Tstart2 of the related-art oscillator. For example, the start-up time Tstart1 is about 100 μs, and the start-up time Tstart2 is not shorter than 200 μs.

Figure 4:
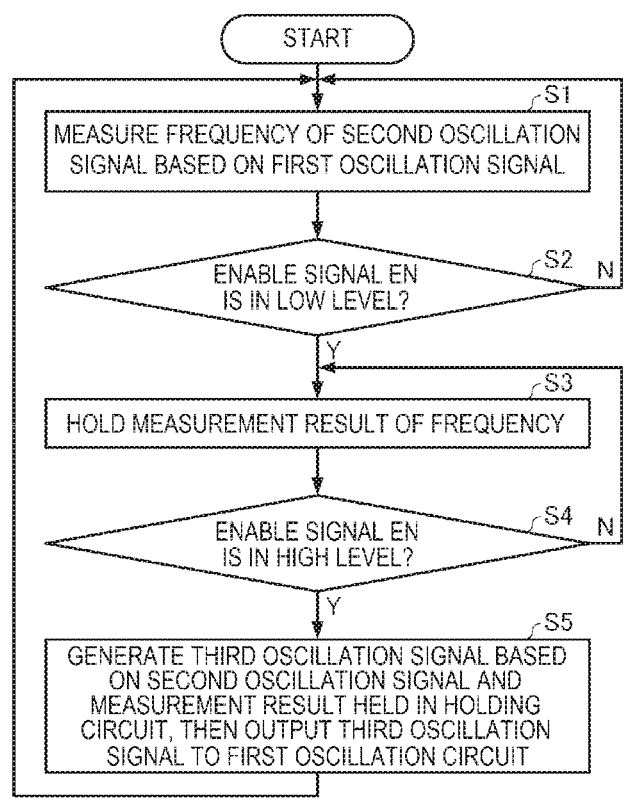
FIG. 4 is a flowchart showing an example of a method of controlling an oscillation circuit according to the embodiment.

FIG. 4 is a flowchart showing an example of a method of controlling the oscillation circuit according to the present embodiment. As shown in FIG. 4, firstly, in the step S1, the frequency measurement circuit 30 measures the frequency of the second oscillation signal CK2 based on the first oscillation signal CK1.

Then, in the step S2, the transition to the step S1 is made when the enable signal EN is in the low level, and the transition to the step S3 is made when the enable signal EN is in the high level.

Then, in the step S3, the holding circuit 40 holds the measurement result of the frequency of the second oscillation signal CK2.

Then, in the step S4, the transition to the step S3 is made when the enable signal EN is in the high level, and the transition to the step S5 is made when the enable signal EN is in the low level.

Then, in the step S5, the oscillation signal generation circuit 50 generates the third oscillation signal CK3 based on the second oscillation signal CK2 and the measurement results held in the holding circuit 40, and then outputs the third oscillation signal CK3 to the first oscillation circuit 10 via the switch circuit 60.

Then, the step S1 through the step S5 are repeatedly performed. As described above, in the method of controlling the oscillation circuit according to the present embodiment, the step S1 in which the frequency measurement circuit 30 measures the frequency of the second oscillation signal CK2, the step S3 in which the holding circuit 40 holds the measurement result of the frequency of the second oscillation signal CK2, and the step S5 in which the oscillation signal generation circuit 50 generates the third oscillation signal CK3 to output the third oscillation signal CK3 to the first oscillation circuit 10 are repeatedly performed in this order.

It should be noted that the step S1 shown in FIG. 4 is an example of a "frequency measurement step." Further, the step S3 shown in FIG. 4 is an example of a "holding step." Further, the step S5 shown in FIG. 4 is an example of an "oscillation signal generation step."

As described hereinabove, in the oscillator 1 according to the first embodiment, the frequency measurement circuit 30 measures the frequency of the second oscillation signal CK2 based on the first oscillation signal CK1 in the first period P1 in which the first oscillation circuit 10 is in operation, the holding circuit 40 holds the measurement result by the frequency measurement circuit 30 in the second period P2 in which the first oscillation circuit 10 is not in operation, the oscillation signal generation circuit 50 generates the third oscillation signal CK3 based on the second oscillation signal CK2 and the measurement results held in the holding circuit 40 in the third period P3 in which the first oscillation circuit 10 starts up, and thus, the third oscillation signal CK3 is supplied to the first oscillation circuit 10 in the third period P3. Therefore, according to the first embodiment, since the frequency ratio between the first oscillation signal CK1 and the second oscillation signal CK2 taking the variation in the semiconductor process or the temperature characteristics inherent in the circuit elements into consideration is measured in the first period P1, and the third oscillation signal CK3 having the frequency decided based on the measurement result in the first period P1 is supplied to the first oscillation circuit 10 in the third period P3, it is possible to reduce the variation in the start-up time of the oscillator 1 or the oscillation circuit 2.

Further, in the oscillator 1 according to the first embodiment, the frequency measurement circuit 30 measures the frequency of the second oscillation signal CK2 a plurality of times, and the holding circuit 40 sequentially holds the plurality of times of measurement results by the frequency measurement circuit 30, and the oscillation signal generation circuit 50 generates the third oscillation signal CK3 based on the plurality of times of measurement results held in the holding circuit 40. Therefore, according to the first embodiment, since the influence of the variation in the measurement error of the frequency of the second oscillation signal CK2 in the frequency of the third oscillation signal CK3 decreases, it is possible to further reduce the variation in the start-up time of the oscillator 1 or the oscillation circuit 2.

Further, according to the first embodiment, since it is possible to approximate the frequency of the third oscillation signal CK3 in the third period P3 to the frequency of the first oscillation signal CK1 when the first oscillation circuit 10 stably oscillates in the first period P1, it is possible to shorten the start-up time of the oscillator 1 or the oscillation circuit 2.

1-2. Second Embodiment

Hereinafter, regarding the oscillator 1 according to the second embodiment, substantially the same constituents as those in the first embodiment will be denoted by the same reference numerals, and different contents from those in the first embodiment are mainly described while omitting or simplifying substantially the same description as in the first embodiment.

Figure 5:
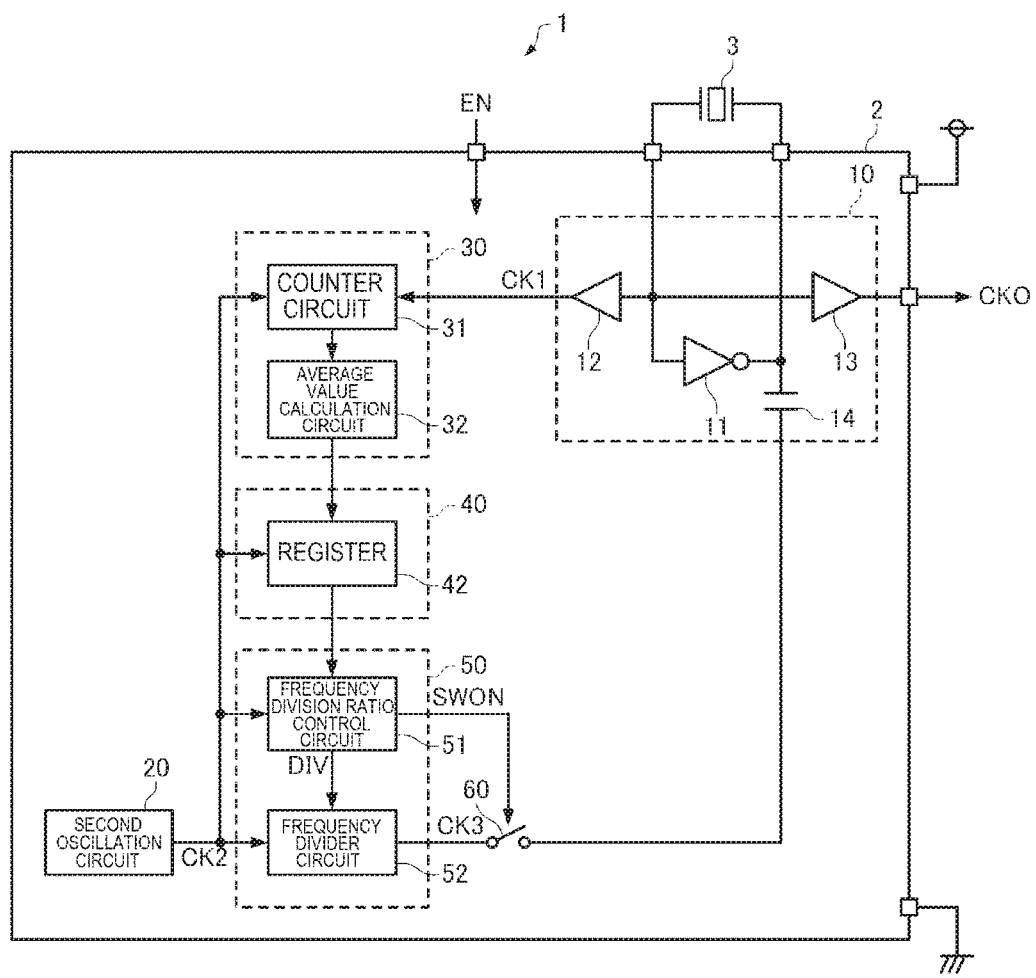
FIG. 5 is a diagram showing a configuration example of an oscillator according to a second embodiment.

FIG. 5 is a diagram showing a configuration example of the oscillator 1 according to the second embodiment. As shown in FIG. 5, in the oscillator 1 according to the second embodiment, the oscillation circuit 2 includes the first oscillation circuit 10, the second oscillation circuit 20, the frequency measurement circuit 30, the holding circuit 40, the oscillation signal generation circuit 50, and the switch circuit 60 similarly to the first embodiment. Since the configuration and the operation of the first oscillation circuit 10 are substantially the same as in the first embodiment, the description thereof will be omitted.

In the second embodiment, the frequency measurement circuit 30 measures the frequency of the second oscillation signal CK2 a plurality of times, and calculates an average value of the frequencies of the second oscillation signal CK2 measured the plurality of times. Specifically, the frequency measurement circuit 30 includes the counter circuit 31 and an average value calculation circuit 32.

The counter circuit 31 counts the number of the rising edges of the second oscillation signal CK2 included in one cycle of the first oscillation signal CK1.

The average value calculation circuit 32 calculates the average value of the numbers of the rising edges of the second oscillation signal CK2 counted last m times by the counter circuit 31. The reference symbol m denotes an integer equal to or greater than 2. For example, when m is 5, and the numbers of the rising edges of the second oscillation signal CK2 counted last five times by the counter circuit 31 are 5, 4, 4, 5, and 4, the average value calculation circuit 32 obtains 4.4 as the average value. The average value calculated by the average value calculation circuit 32 represents a frequency ratio between the second oscillation signal CK2 and the first oscillation signal CK1, and is a measurement result of the frequency of the second oscillation signal CK2.

In the second embodiment, the holding circuit 40 holds the average value calculated by the frequency measurement circuit 30 as the measurement result by the frequency measurement circuit 30. Specifically, the holding circuit 40 includes a register 42, and the register 42 holds, in sync with the second oscillation signal CK2, the last average value calculated by the average value calculation circuit 32 as the measurement result by the frequency measurement circuit 30.

The oscillation signal generation circuit 50 generates a third oscillation signal CK3 based on the second oscillation signal CK2 and the measurement result held in the holding circuit 40.

In the second embodiment, the oscillation signal generation circuit 50 includes the frequency division ratio control circuit 51 and the frequency divider circuit 52, and generates the third oscillation signal CK3 based on the measurement result held in the holding circuit 40.

The frequency division ratio control circuit 51 controls the frequency division ratio DIV of the frequency divider circuit 52 based on the measurement result held in the holding circuit 40. Specifically, the frequency division ratio control circuit 51 retrieves the measurement result held in the register 42 in sync with the second oscillation signal CK2, then performs delta-sigma modulation on the measurement result thus retrieved to sequentially generate m frequency division ratios DIV, and then outputs the m frequency division ratios DIV to the frequency divider circuit 52. For example, when m is 5, and the measurement result held by the register 42 is 4.4, the frequency division ratio control circuit 51 sequentially generates the frequency division ratios DIV of, for example, 5, 4, 4, 5, and 4.

The frequency divider circuit 52 divides the frequency of the second oscillation signal CK2 with the frequency division ratio DIV to generate the third oscillation signal CK3.

Since an average value of the m frequency division ratios DIV is equal to the measurement result held in the register 42, the average frequency of the third oscillation signal CK3 is substantially equal to the frequency of the first oscillation signal CK1.

Further, the frequency division ratio control circuit 51 outputs the switch control signal SWON which is activated only in the period in which the frequency divider circuit 52 generates the third oscillation signal CK3 corresponding to the measurement result held in the register 42.

The switch circuit 60 electrically couples or decouples the frequency divider circuit 52 and the first oscillation circuit 10 to each other based on the switch control signal SWON. Specifically, the switch circuit 60 electrically couples the frequency divider circuit 52 and the first oscillation circuit 10 to each other when the switch control signal SWON is in the active state, and electrically decouples the frequency divider circuit 52 and the first oscillation circuit 10 to each other when the switch control signal SWON is in the inactive state.

Therefore, in the period in which the switch control signal SWON is in the active state, the frequency divider circuit 52 and the first oscillation circuit 10 are electrically coupled to each other, and the third oscillation signal CK is supplied to the first oscillation circuit 10. The third oscillation signal CK3 is input to one end of the resonator 3 via the capacitor 14 in the first oscillation circuit 10.

Also in the second embodiment, similarly to the first embodiment, the frequency measurement circuit 30 measures the frequency of the second oscillation signal CK2 based on the first oscillation signal CK1 in the first period P1 in which the first oscillation circuit 10 is in operation. Further, the holding circuit 40 holds the measurement result by the frequency measurement circuit 30 in the second period P2 in which the first oscillation circuit 10 is not in operation. Further, the oscillation signal generation circuit 50 generates the third oscillation signal CK3 based on the second oscillation signal CK2 and the measurement result held in the holding circuit 40 in the third period P3 in which the first oscillation circuit 10 starts up.

As described hereinabove, in the oscillator 1 according to the second embodiment, the frequency measurement circuit 30 measures the frequency of the second oscillation signal CK2 a plurality of times in the first period P1 in which the first oscillation circuit 10 is in operation, and then calculates the average value of the frequencies of the second oscillation signal CK2 measured the plurality of times, the holding circuit 40 holds the average value of the frequencies of the second oscillation signal CK2 based on the first oscillation signal CK1 in the second period P2 in which the first oscillation circuit 10 is not in operation, the oscillation signal generation circuit 50 generates the third oscillation signal CK3 based on the second oscillation signal CK2 and the average value held in the holding circuit 40 in the third period P3 in which the first oscillation circuit 10 starts up, and thus, the third oscillation signal CK3 is supplied to the first oscillation circuit 10 in the third period P3. Therefore, according to the second embodiment, since the average value of the frequency ratios between the first oscillation signal CK1 and the second oscillation signal CK2 taking the variation in the semiconductor process or the temperature characteristics inherent in the circuit elements into consideration is calculated in the first period P1, and the third oscillation signal CK3 having the frequency decided based on the average value calculated in the first period P1 is supplied to the first oscillation circuit 10 in the third period P3, it is possible to reduce the variation in the start-up time of the oscillator 1 or the oscillation circuit 2.

Further, according to the second embodiment, since the average value of the frequencies of the second oscillation signal CK2 is calculated, and therefore the influence of the variation in the measurement error of the frequency of the second oscillation signal CK2 in the frequency of the third oscillation signal CK3 decreases, it is possible to further reduce the variation in the start-up time of the oscillator 1 or the oscillation circuit 2.

Further, according to the second embodiment, since it is possible to approximate the frequency of the third oscillation signal CK3 in the third period P3 to the frequency of the first oscillation signal CK1 when the first oscillation circuit 10 stably oscillates in the first period P1, it is possible to shorten the start-up time of the oscillator 1 or the oscillation circuit 2.

1-3. Third Embodiment

Hereinafter, regarding the oscillator 1 according to the third embodiment, substantially the same constituents as those in the first embodiment or the second embodiment will be denoted by the same reference numerals, and different contents from those in the first embodiment and the second embodiment are mainly described while omitting or simplifying substantially the same description as in the first embodiment or the second embodiment.

Figure 6:
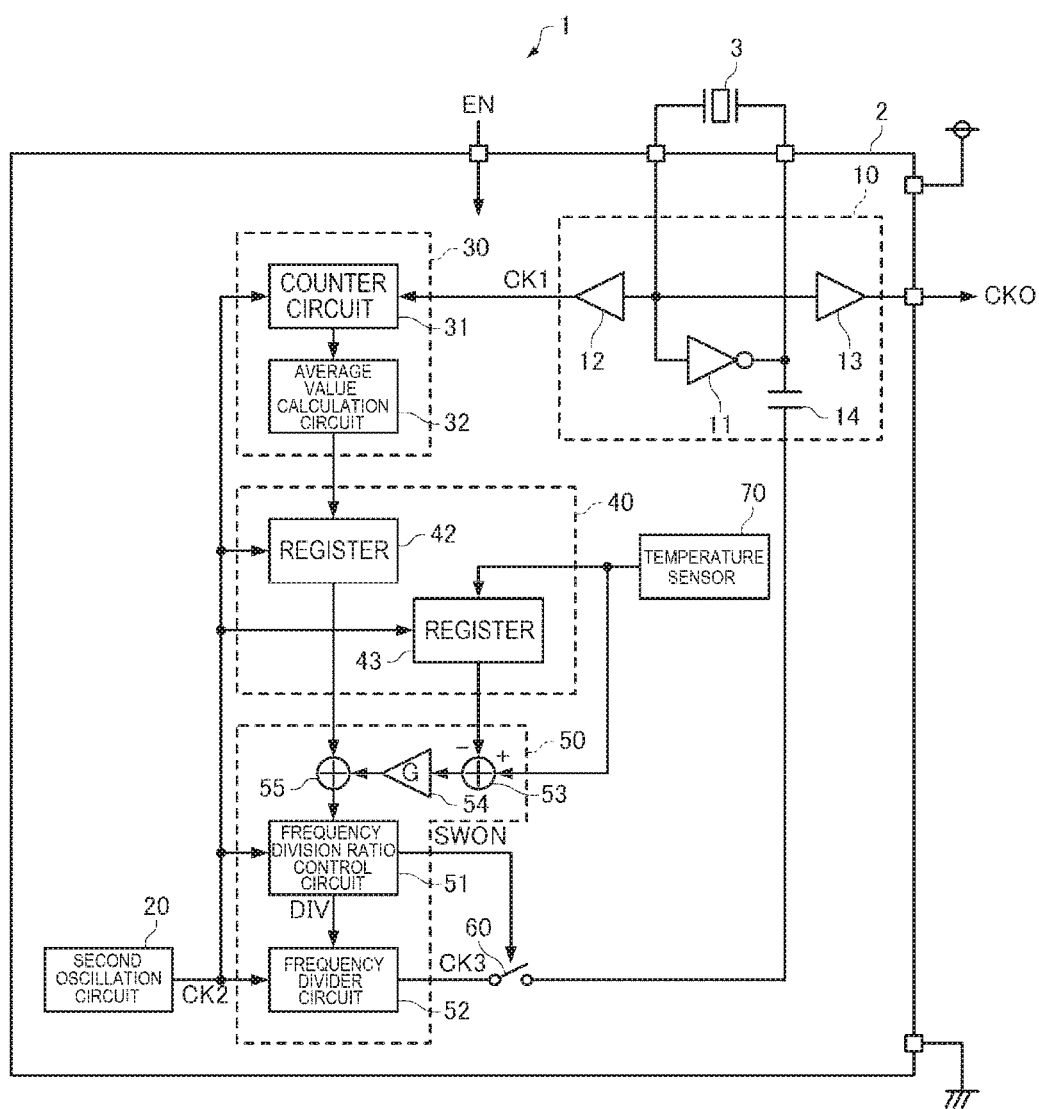
FIG. 6 is a diagram showing a configuration example of an oscillator according to a third embodiment.

FIG. 6 is a diagram showing a configuration example of the oscillator 1 according to the third embodiment. As shown in FIG. 6, in the oscillator 1 according to the third embodiment, the oscillation circuit 2 includes the first oscillation circuit 10, the second oscillation circuit 20, the frequency measurement circuit 30, the holding circuit 40, the oscillation signal generation circuit 50, and the switch circuit 60 similarly to the first embodiment, and further includes a temperature sensor 70. Since the configuration and the operation of the first oscillation circuit 10 are substantially the same as in the first embodiment, the description thereof will be omitted. Further, since the configuration and the operation of the frequency measurement circuit 30 are substantially the same as in the second embodiment, the description thereof will be omitted.

In the third embodiment, the holding circuit 40 holds the measurement result by the frequency measurement circuit 30, and at the same time, holds temperature information detected by the temperature sensor 70 when the frequency measurement circuit 30 measures the frequency of the second oscillation signal CK2. Specifically, the holding circuit 40 includes the register 42 and a register 43, and the register 42 holds, in sync with the second oscillation signal CK2, the last average value calculated by the average value calculation circuit 32 as the calculation result by the frequency measurement circuit 30, and the register 43 holds, in sync with the second oscillation signal CK2, the temperature information detected by the temperature sensor 70.

In the first embodiment and the second embodiment, when the frequency of the second oscillation signal CK2 changes with the temperature, there occurs a difference between the frequency of the second oscillation signal CK2 when the frequency measurement circuit 30 has measured the frequency of the second oscillation signal CK2 and the frequency of the second oscillation signal CK2 when the oscillation signal generation circuit 50 generates the third oscillation signal CK3. Therefore, when the oscillation signal generation circuit 50 generates the third oscillation signal CK3 based on the measurement result held in the holding circuit 40, a difference between the resonance frequency of the resonator 3 and the third oscillation signal CK3 becomes large, and there is a possibility that the shortening effect of the start-up time is reduced.

Therefore, in the third embodiment, the oscillation signal generation circuit 50 corrects the measurement result held in the holding circuit 40 based on the difference between the temperature information detected by the temperature sensor 70 and the temperature information held in the holding circuit 40, and then generates the third oscillation signal CK3 based on the measurement result thus corrected.

In the third embodiment, the oscillation signal generation circuit 50 includes the frequency division ratio control circuit 51, the frequency divider circuit 52, a subtractor 53, a multiplier 54, and an adder 55.

The subtractor 53 calculates the difference between the temperature information detected by the temperature sensor 70 and the temperature information held in the register 43.

The multiplier 54 multiplies the calculation result of the subtractor 53 by G. In the present embodiment, the frequency of the second oscillation signal CK2 linearly changes with the temperature, and the gradient corresponds to G.

The adder 55 calculates a sum of the measurement result held in the register 43 and the multiplication result by the multiplier 54. The calculation result by the adder 55 corresponds to a measurement result obtained by performing the temperature correction on the measurement result held by the holding circuit 40.

The frequency division ratio control circuit 51 controls the frequency division ratio DIV of the frequency divider circuit 52 based on the calculation result by the adder 55. Specifically, the frequency division ratio control circuit 51 performs the delta-sigma modulation on the calculation result by the adder 55 to sequentially generate m frequency division ratios DIV, and then outputs the m frequency division ratios DIV to the frequency divider circuit 52 in sync with the second oscillation signal CK2.

The frequency divider circuit 52 divides the frequency of the second oscillation signal CK2 with the frequency division ratio DIV to generate the third oscillation signal CK3. Since an average value of the m frequency division ratios DIV is equal to the calculation result by the adder 55, namely the measurement result obtained by performing the temperature correction on the measurement result held in the holding circuit 40, the average frequency of the third oscillation signal CK3 is substantially equal to the frequency of the first oscillation signal CK1.

Further, the frequency division ratio control circuit 51 outputs the switch control signal SWON which is activated only in the period in which the frequency divider circuit 52 generates the third oscillation signal CK3 corresponding to the calculation result by the adder 55.

The switch circuit 60 electrically couples or decouples the frequency divider circuit 52 and the first oscillation circuit 10 to each other based on the switch control signal SWON. Specifically, the switch circuit 60 electrically couples the frequency divider circuit 52 and the first oscillation circuit 10 to each other when the switch control signal SWON is in the active state, and electrically decouples the frequency divider circuit 52 and the first oscillation circuit 10 to each other when the switch control signal SWON is in the inactive state.

Therefore, in the period in which the switch control signal SWON is in the active state, the frequency divider circuit 52 and the first oscillation circuit 10 are electrically coupled to each other, and the third oscillation signal CK3 is supplied to the first oscillation circuit 10. The third oscillation signal CK3 is input to one end of the resonator 3 via the capacitor 14 in the first oscillation circuit 10.

Also in the third embodiment, similarly to the first embodiment and the second embodiment, the frequency measurement circuit 30 measures the frequency of the second oscillation signal CK2 based on the first oscillation signal CK1 in the first period P1 in which the first oscillation circuit 10 is in operation. Further, the holding circuit 40 holds the measurement result by the frequency measurement circuit 30 in the second period P2 in which the first oscillation circuit 10 is not in operation. Further, the oscillation signal generation circuit 50 generates the third oscillation signal CK3 based on the second oscillation signal CK2 and the measurement result held in the holding circuit 40 in the third period P3 in which the first oscillation circuit 10 starts up.

As described hereinabove, in the oscillator 1 according to the third embodiment, the frequency measurement circuit 30 measures the frequency of the second oscillation signal CK2 based on the first oscillation signal CK1 in the first period P1 in which the first oscillation circuit 10 is in operation, the holding circuit 40 holds the measurement result of the frequency of the second oscillation signal CK2 and at the same time holds the temperature information detected by the temperature sensor 70 when the frequency measurement circuit 30 has measured the frequency of the second oscillation signal CK2 in the second period P2 in which the first oscillation circuit 10 is not in operation, the oscillation signal generation circuit 50 corrects the measurement result held in the holding circuit 40 based on the difference between the temperature information detected by the temperature sensor 70 and the temperature information held in the holding circuit 40, and then generates the third oscillation signal CK3 based on the measurement result thus corrected in the third period P3 in which the first oscillation circuit 10 starts up, and thus, the third oscillation signal CK3 is supplied to the first oscillation circuit 10 in the third period P3. Therefore, according to the third embodiment, since the frequency ratio between the first oscillation signal CK1 and the second oscillation signal CK2 taking the variation in the semiconductor process or the temperature characteristics inherent in the circuit elements into consideration is measured in the first period P1, and the third oscillation signal CK3 having the frequency decided based on the measurement result obtained by performing the temperature correction on the measurement result in the first period P1 taking the temperature characteristic of the second oscillation circuit 20 into consideration is supplied to the first oscillation circuit 10 in the third period P3 even when the temperature rapidly changes in the second period P2, it is possible to further reduce the variation in the start-up time of the oscillator 1 or the oscillation circuit 2.

Further, in the oscillator 1 according to the third embodiment, the frequency measurement circuit 30 measures the frequency of the second oscillation signal CK2 a plurality of times in the first period P1, and then calculates the average value of the frequencies of the second oscillation signal CK2 measured the plurality of times, the holding circuit 40 holds the average value of the frequencies of the second oscillation signal CK2 based on the first oscillation signal CK1 in the second period P2, the oscillation signal generation circuit 50 generates the third oscillation signal CK3 based on the second oscillation signal CK2 and the average value and the temperature information held in the holding circuit 40 in the third period P3. Therefore, according to the third embodiment, since the average value of the frequency ratios between the first oscillation signal CK1 and the second oscillation signal CK2 taking the variation in the semiconductor process or the temperature characteristics inherent in the circuit elements into consideration is calculated in the first period P1, and the third oscillation signal CK3 having the frequency decided based on the average value obtained by correcting the average value calculated in the first period P1 taking the temperature characteristic of the second oscillation circuit 20 into consideration is supplied to the first oscillation circuit 10 in the third period P3 even when the temperature rapidly changes in the second period P2, it is possible to further reduce the variation in the start-up time of the oscillator 1 or the oscillation circuit 2.

Further, according to the third embodiment, since it is possible to approximate the frequency of the third oscillation signal CK3 in the third period P3 to the frequency of the first oscillation signal CK1 when the first oscillation circuit 10 stably oscillates in the first period P1, it is possible to shorten the start-up time of the oscillator 1 or the oscillation circuit 2.

1-4. Modified Examples

Although in each of the embodiments described above, the second oscillation circuit 20 is, for example, a ring oscillator, this is not a limitation, and it is also possible for the second oscillation circuit 20 to be a CR oscillation circuit, an LC oscillation circuit, or the like.

Further, although in each of the embodiments described above, the resonator 3 is a quartz crystal resonator, this is not a limitation, and it is also possible for the resonator 3 to be an MEMS (Micro Electro Mechanical Systems) resonator, a BAW (Bulk Acoustic Wave) resonator, a SAW (Surface Acoustic Wave) resonator, or the like. Further, as the substrate material of the resonator 3, there can be used a piezoelectric single crystal of lithium tantalate, lithium niobate, or the like, a piezoelectric material such as piezoelectric ceramics including lead zirconate titanate, or a silicon semiconductor material besides the quartz crystal. As an excitation device of the resonator 3, there can be used a device using a piezoelectric effect, or electrostatic drive using a coulomb force.

Further, in each of the embodiments described above, the frequency measurement circuit 30 counts the number of rising edges of the second oscillation signal CK2 included in one cycle of the first oscillation signal CK1 using, for example, a counter circuit 31 to thereby measure the frequency ratio between the first oscillation signal CK1 and the second oscillation signal CK2, but the method of measuring the frequency ratio is not limited thereto. For example, it is possible for the frequency measurement circuit 30 to measure the frequency ratio between the first oscillation signal CK1 and the second oscillation signal CK2 using a time-to-digital converter (TDC).

Further, although in each of the embodiments described above, the frequency division ratio control circuit 51 controls the frequency division ratio DIV of the frequency divider circuit 52 to thereby control the frequency of the third oscillation signal CK3, this is not a limitation. For example, it is possible to configure the second oscillation circuit 20 as a variable frequency oscillation circuit such as a voltage controlled oscillator (VCO), set a fixed value as the frequency division ratio DIV of the frequency divider circuit 52, and it is possible for the oscillation signal generation circuit 50 to control the frequency of the second oscillation signal CK2 to thereby control the frequency of the third oscillation signal CK3.

2. Communication Device

Figure 7:
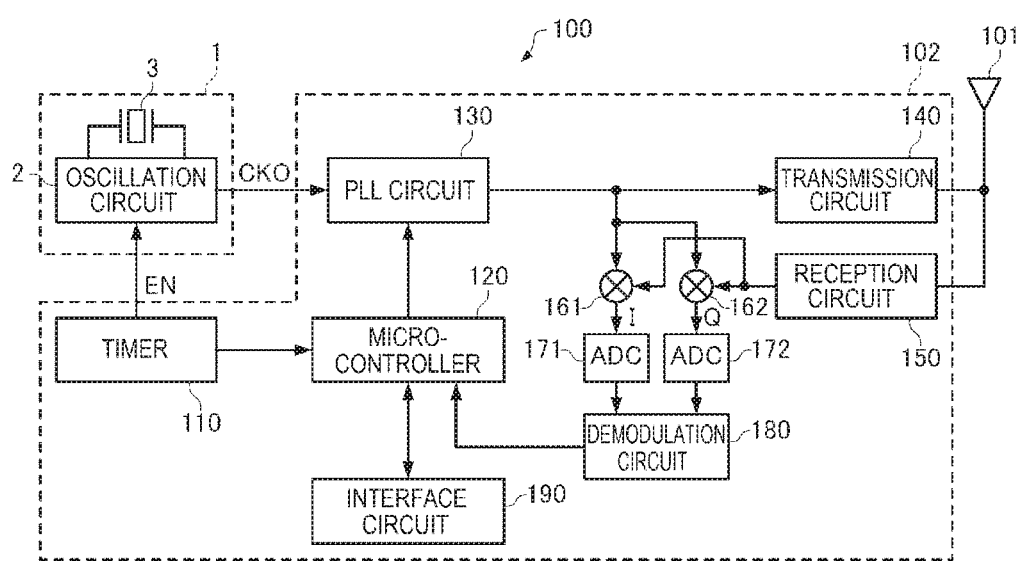
FIG. 7 is a functional block diagram of a communication device according to the embodiment.

FIG. 7 is a functional block diagram of a communication device according to the present embodiment. As shown in FIG. 7, the communication device 100 according to the present embodiment includes the oscillator 1, an antenna 101, and a processing circuit 102. The oscillator 1 is, for example, the oscillator 1 according to each of the embodiments described above or each of the modified examples, and includes the oscillation circuit 2 and the resonator 3 described above. For example, the processing circuit 102 can be a single-chip integrated circuit, or the oscillation circuit 2 and the processing circuit 102 can be included in a single-chip integrated circuit.

The processing circuit 102 makes the oscillator 1 operate intermittently. Specifically, under the control by the processing circuit 102, the oscillation circuit 2 repeatedly performs the operation in the first period P1, the operation in the second period P2, and the operation in the third period P3 described above as the intermittent operation. Further, the processing circuit 102 performs a transmission process and a reception process when the oscillator 1 is in operation. In the present embodiment, the processing circuit 102 includes a timer 110, a micro-controller 120, a PLL (Phase Locked Loop) circuit 130, a transmission circuit 140, a reception circuit 150, mixers 161, 162, A/D conversion circuits 171, 172, a demodulation circuit 180, and an interface circuit 190. It should be noted that the processing circuit 102 can have a configuration obtained by eliminating or modifying some of these constituents, or adding other constituents.

The timer 110 measures the time to generate the enable signal EN activated for a predetermined time at predetermined time intervals. The oscillator 1 operates when the enable signal EN is in the active state, and stops when the enable signal EN is in the inactive state.

The PLL circuit 130 converts the oscillation signal CKO output from the oscillation circuit 2 into a signal in the frequency band of a predetermined communication standard.

The micro-controller 120 distinguishes a transmission period, a reception period, and a period in which the transmission and the reception stop from each other based on a value of the timer 110. The micro-controller 120 holds transmission information in a storage section not shown, and controls the multiplication ratio of the PLL circuit 130 based on the transmission information in the transmission period.

The transmission circuit 140 amplifies an output signal of the PLL circuit 130, and then performs a filter process of reducing an unwanted frequency component included in the signal thus amplified. The signal on which the filter process has been performed is transmitted by an antenna 101 as a radio wave.

The reception circuit 150 performs the filter process of reducing an unwanted frequency component included in the radio wave received by the antenna 101, and then amplifies the weak signal on which the filter process has been performed.

The mixers 161, 162 each mix the signal amplified by the reception circuit 150 with the output signal of the PLL circuit 130 to convert the signal into a baseband signal. The output signals of the PLL circuit 130 to be input to the respective mixers 161, 162 are shifted in phase as much as 90° from each other, an I (In-phase) signal is output from the mixer 161, and a Q (Quadrature-phase) signal is output from the mixer 162.

The A/D conversion circuit 171 converts the I signal output from the mixer 161 into a digital signal.

The A/D conversion circuit 172 converts the Q signal output from the mixer 162 into a digital signal.

The demodulation circuit 180 performs a process of demodulating the reception information from the I signal and the Q signal thus converted into the digital signals by the A/D conversion circuits 171, 172.

The micro-controller 120 sets the multiplication ratio of the PLL circuit 130 to a predetermined value in the reception period. Then, the micro-controller 120 performs a variety of types of processing based on the reception information demodulated by the demodulation circuit 180.

It should be noted that the micro-controller 120 is capable of performing data communication with an external device not shown via the interface circuit 190. For example, the micro-controller 120 receives the transmission information from the external device, and then holds the transmission information thus received in the storage section not shown.

Figure 8:
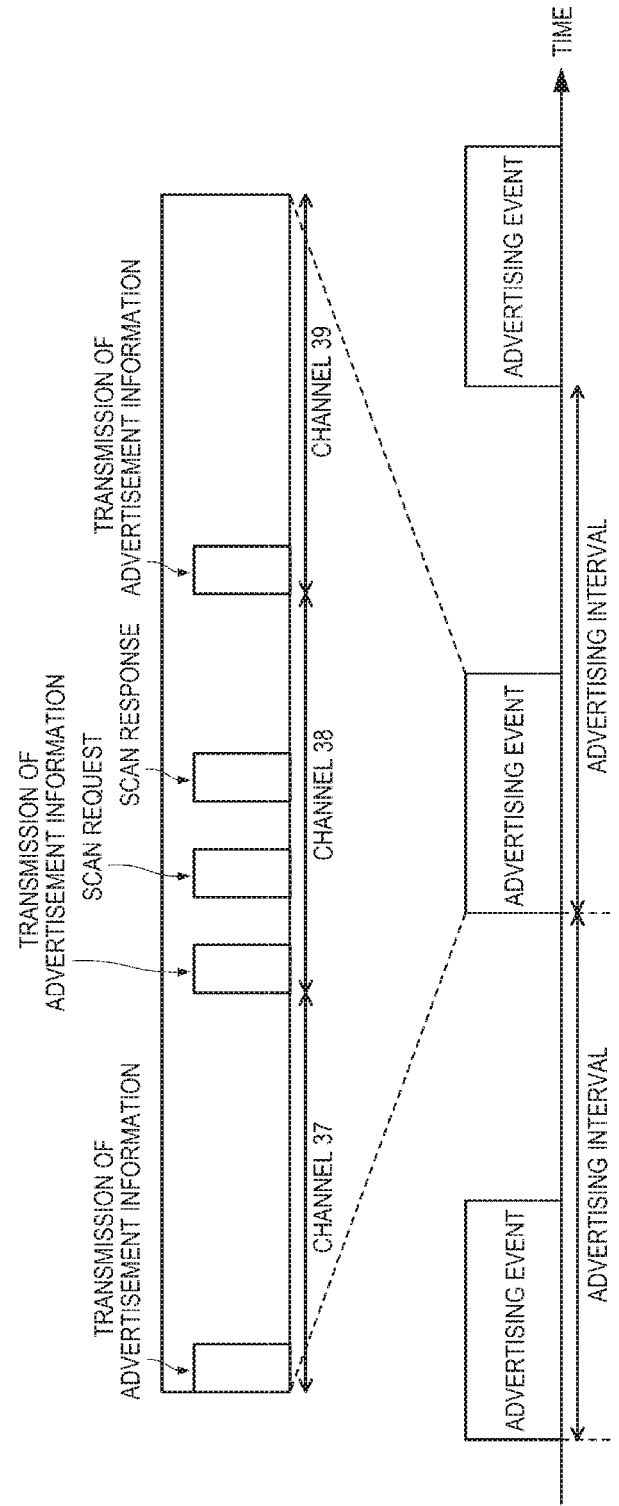
FIG. 8 is an explanatory diagram of advertising communication in the BLE.

For example, the processing circuit 102 can perform advertising communication in the BLE (Bluetooth (registered trademark) Low Energy). FIG. 8 is a diagram for explaining the advertising communication in the BLE. In the BLE, there are defined 40 channels obtained by dividing the band from 2.400 GHz to 2.480 GHz by a width of 2 MHz. The channels 0 through 36 are used for data communication, and three channels, namely the channel 37 in the 2.402 GHz band, the channel 38 in the 2.426 GHz band, and the channel 39 in the 2.480 GHz band, are used for the advertising communication.

As shown in FIG. 8, the processing circuit 102 repeatedly performs the process of the advertising event at desired intervals. The processing circuit 102 performs the advertising communication using the channels 37, 38, and 39 as each of the advertising events.

The micro-controller 120 holds advertisement information as the transmission information, and in each of the advertising events, the micro-controller 120 firstly controls the multiplication ratio of the PLL circuit 130 so that the output signal of the PLL circuit 130 is frequency-modulated in accordance with the bit values of the advertisement information centering on 2.402 GHz. The output signal of the PLL circuit 130 is transmitted as the radio wave by the antenna 101 via the transmission circuit 140. In such a manner, the communication device 100 transmits the advertisement information using the channel 37.

Then, when a predetermined time elapses, the micro-controller 120 controls the multiplication ratio of the PLL circuit 130 so that the output signal of the PLL circuit 130 is frequency-modulated in accordance with the bit values of the advertisement information centering on 2.426 GHz. The output signal of the PLL circuit 130 is transmitted as the radio wave by the antenna 101 via the transmission circuit 140. In such a manner, the communication device 100 transmits the advertisement information using the channel 38.

Then, when a predetermined time elapses, the micro-controller 120 controls the multiplication ratio of the PLL circuit 130 so that the output signal of the PLL circuit 130 is frequency-modulated in accordance with the bit values of the advertisement information centering on 2.480 GHz. The output signal of the PLL circuit 130 is transmitted as the radio wave by the antenna 101 via the transmission circuit 140. In such a manner, the communication device 100 transmits the advertisement information using the channel 39.

The communication device 100 transmits the advertisement information sequentially using the channels 37, 38, and 39 as each of the advertising events. Further, it is possible for an electronic apparatus having received the advertisement information to establish a connection to the communication device 100, and then perform the data communication with the communication device 100 using any one of the channels 0 through 36.

An amount of the advertisement information which can be transmitted at one time in each of the channels by the communication device 100 is a maximum of 31 bytes. Therefore, when the amount of the advertisement information held by the micro-controller 120 exceeds 31 bytes, the electronic apparatus having received the advertisement information transmits a scan request for requesting the transmission of the remaining advertisement information of the communication device 100 when receiving a part of the advertisement information. When the communication device 100 has received the scan request as the reception information, the micro-controller 120 controls the multiplication ratio of the PLL circuit 130 in accordance with the bit values of the remaining advertisement information. Then, as a scan response, the output signal of the PLL circuit 130 is transmitted as the radio wave by the antenna 101 via the transmission circuit 140. It is possible for the electronic apparatus having received the scan response to establish the connection to the communication device 100, and then perform the data communication with the communication device 100 using any one of the channels 0 through 36.

In such a communication device 100, the oscillator 1 starts up before the transmission period for periodically transmitting the information, then stably operates in the transmission period and the reception period, and stops when the transmission period and the reception period end. By the oscillator 1 intermittently operating as described above, the power consumption of the communication device 100 can dramatically be reduced. Therefore, even when, for example, the communication device 100 operates with a primary cell, it is possible to extend the operating life of the communication device 100.

It should be noted that the communication device 100 can also be a beacon which continues to transmit the advertisement information. In this case, in FIG. 7, the reception circuit 150, the mixers 161, 162, the A/D conversion circuits 171, 172, and the demodulation circuit 180 can be eliminated. Since such a beacon does not perform reception, and therefore the oscillator 1 can immediately be stopped when the transmission period ends, the life-extension effect by the intermittent operation of the oscillator 1 is enhanced.

Since the communication device 100 according to the present embodiment includes the oscillator 1 capable of reducing the variation in the start-up time, it is possible to decrease the margin of the start-up time of the oscillator 1, and it is possible to shorten the period in which the oscillator 1 operates in the intermittent operation of the oscillator 1. Therefore, it is possible to realize the communication device 100 low in power consumption.

The present disclosure is not limited to the present embodiment, but can be implemented with a variety of modifications within the scope or the spirit of the present disclosure.

The embodiments and the modified examples described above are illustrative only, and the present disclosure is not limited to the embodiments and the modified examples. For example, it is also possible to arbitrarily combine the embodiments and the modified examples described above with each other.

The present disclosure includes configurations substantially the same as the configuration described as the embodiments, for example, configurations having the same function, the same way, and the same result, or configurations having the same object and the same advantage. Further, the present disclosure includes configurations obtained by replacing a non-essential part of the configuration described as the embodiments. Further, the present disclosure includes configurations providing the same functions and advantages and configurations capable of achieving the same object as those of the configuration described as the embodiments. Further, the present disclosure includes configurations obtained by adding known technologies to the configuration described as the embodiments.

What is claimed is:

1. An oscillation circuit comprising:
   a first oscillation circuit configured to oscillate a resonator to generate a first oscillation signal;
   a second oscillation circuit configured to generate a second oscillation signal;
   a frequency measurement circuit configured to measure a frequency of the second oscillation signal based on the first oscillation signal in a first period in which the first oscillation circuit is in operation;
   a holding circuit configured to hold a measurement result by the frequency measurement circuit in a second period in which the first oscillation circuit is not in operation; and
   an oscillation signal generation circuit configured to generate a third oscillation signal based on the second oscillation signal and the measurement result held in the holding circuit in a third period in which the first oscillation circuit starts up, wherein
   the third oscillation signal is supplied to the first oscillation circuit in the third period.

2. An oscillation circuit comprising:
   a first oscillation circuit configured to oscillate a resonator to generate a first oscillation signal;
   a second oscillation circuit configured to generate a second oscillation signal;
   a frequency measurement circuit which includes a counter circuit configured to perform a counting operation based on the first oscillation signal and the second oscillation signal, and is configured to measure a frequency of the second oscillation signal;
   a holding circuit configured to hold a measurement result by the frequency measurement circuit;
   an oscillation signal generation circuit including a frequency divider circuit configured to divide the frequency of the second oscillation signal to generate a third oscillation signal, and a frequency division ratio control circuit configured to control a frequency division ratio of the frequency divider circuit based on the measurement result held in the holding circuit; and
   a switch circuit configured to electrically couple or decouple the frequency divider circuit and the first oscillation circuit to each other.

3. The oscillation circuit according to claim 1, wherein
   the frequency measurement circuit measures the frequency of the second oscillation signal a plurality of times,
   the holding circuit sequentially holds the plurality of times of measurement results by the frequency measurement circuit, and
   the oscillation signal generation circuit generates the third oscillation signal based on the plurality of times of measurement results held in the holding circuit.

4. The oscillation circuit according to claim 1, wherein
   the frequency measurement circuit measures the frequency of the second oscillation signal a plurality of times, and then calculates an average value of the frequencies of the second oscillation signal measured the plurality of times, and
   the holding circuit holds the average value as the measurement result by the frequency measurement circuit.

5. The oscillation circuit according to claim 1, further comprising:
   a temperature sensor, wherein
   the holding circuit holds temperature information detected by the temperature sensor when the frequency measurement circuit measures the frequency of the second oscillation signal, and
   the oscillation signal generation circuit corrects the measurement result held in the holding circuit based on a difference between the temperature information detected by the temperature sensor and the temperature information held in the holding circuit, and then generates the third oscillation signal based on the measurement result corrected.

6. An oscillator comprising:
   the oscillation circuit according to claim 1; and
   the resonator.

7. A communication device comprising:
   the oscillator according to claim 6; and
   a processing circuit configured to make the oscillator perform an intermittent operation.

8. A communication device comprising:
   an oscillator including the oscillation circuit according to claim 1 and the resonator; and
   a processing circuit configured to make the oscillator perform an intermittent operation, wherein
   the oscillation circuit repeatedly perform an operation in the first period, an operation in the second period, and an operation in the third period as the intermittent operation.

9. The communication device according to claim 7, wherein
   the processing circuit performs advertising communication in BLE (Bluetooth Low Energy) when the oscillator is in operation.

10. A method of controlling an oscillation circuit including a first oscillation circuit configured to oscillate a resonator to generate a first oscillation signal, and a second oscillation circuit configured to generate a second oscillation signal, the method comprising:
    a frequency measurement step of measuring a frequency of the second oscillation signal based on the first oscillation signal in a first period in which the first oscillation circuit is in operation;
    a holding step of holding a measurement result of the frequency in a second period in which the first oscillation circuit is not in operation; and
    an oscillation signal generation step of generating a third oscillation signal based on the second oscillation signal and the measurement result held in a third period in which the first oscillation circuit starts up, and outputting the third oscillation signal to the first oscillation circuit.

11. The method of controlling the oscillation circuit according to claim 10, wherein the frequency measurement step, the holding step, and the oscillation signal generation step are repeatedly performed in this order.

* * * * *